United States Patent
Liang et al.

(10) Patent No.: US 6,511,902 B1
(45) Date of Patent: Jan. 28, 2003

(54) FABRICATION METHOD FOR FORMING ROUNDED CORNER OF CONTACT WINDOW AND VIA BY TWO-STEP LIGHT ETCHING TECHNIQUE

(75) Inventors: Ming-Chung Liang, Taipei (TW); Shin-Yi Tsai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/105,266

(22) Filed: Mar. 26, 2002

(51) Int. Cl.[7] .......................................... H01L 21/4763
(52) U.S. Cl. ........................ 438/620; 438/640; 438/673; 438/713
(58) Field of Search ................................ 438/620, 629, 438/637–640, 668, 672–673, 675, 713, 706

(56) References Cited

U.S. PATENT DOCUMENTS

| | | | |
|---|---|---|---|
| 6,159,847 A | * 12/2000 | Havemann et al. | 438/652 |
| 6,333,265 B1 | * 12/2001 | Dixit et al. | 438/637 |
| 6,384,480 B1 | * 5/2002 | McTeer | 257/750 |
| 6,387,798 B1 | * 5/2002 | Loke et al. | 438/623 |
| 6,391,763 B1 | * 5/2002 | Liu | 438/622 |
| 6,440,847 B1 | * 8/2002 | Lou | 438/639 |

* cited by examiner

Primary Examiner—Tuan H. Nguyen
Assistant Examiner—Thanh Nguyen
(74) Attorney, Agent, or Firm—Rosenberg, Klein & Lee

(57) ABSTRACT

The present invention generally relates to provide a fabrication method for forming a rounded corner of a contact window or a via by using a two-step light etching technique. In the present invention, after the etching process to form the contact window or the via, an object of the invention is to utilize oxygen plasma and fluorocarbon plasma of the two-step light etching technique to produce the rounded corner of the window or via so as this rounded opening profile of the contact window or the via can supply for following metal-filling processes.

12 Claims, 5 Drawing Sheets

FABRICATION METHOD FOR FORMING ROUNDED CORNER OF CONTACT WINDOW AND VIA BY TWO-STEP LIGHT ETCHING TECHNIQUE

BACKGROUND OF THE INVENTION

1. Field of the Invention

The present invention generally relates to an etching technique in the semiconductor manufacture, and more particularly relates to a method for forming a rounded corner of a contact window and a via by using a two-step light etching technique.

2. Description of the Prior Art

In view of the effect of the etching process is remove the non-photoresist-covered and non-protected portion of the membrane by using chemical reaction method or physics way, wherein the membrane is deposited before the photolithograph process and has a thickness between about thousands of angstroms or hundreds of angstroms. In other word, the device pattern of the photo-mask is transferred on the photoresist by the photolithograph process and then transferred to the membrane by the etching process.

In the semiconductor manufacture, the contact between metal layer and silicon surface and the contact between different metal layers are formed by the way of the interconnection according to the metallization process. In general, the contact between metal layer and silicon surface is so-called a contact window and the contact between different metal layers is so-called a via. With the increased density of integrated circuit, the interconnection technique becomes more and more important so as the formulation of the contact window or via also becomes more and more important.

To make an example of the fabrication of the MOS contact window, referring to the FIG. 1A, the figure is a schematic representation structure during the formulation of a contact window. First, a silicon substrate 10 is provided with some basic devices, such as MOS transistors, therein and a dielectric layer 12 is uniformly overlaid on the silicon substrate 10. Then, a patterned photoresist layer 14 is formed on the dielectric layer 12 by photolithograph technique, wherein the photolithograph process comprises the steps of defining the contact window location by the photo-mask, then combining with the MOS etching technique, such as plasma etching process, to form the contact window 16, and removing the patterned photoresist layer 14 to form a contact window for the use of metal-filling, such as shown in the FIG. 1B.

For the purpose of improved metal-filling, after completing the contact window 16 and removing the photoresist layer 14, the conventional method utilizes the higher energy ion to strike the opening of the contact window 16 to achieve the object of the top corner rounding, such as shown in the FIG. 1C. However, the method for rounding the top corner with the higher energy ion will easily cause the disadvantages of charge induced damage and bottom layer loss. Furthermore, it will cause the effect of the bowling profile.

Obviously, the main spirit of the present invention is to provide a fabrication method for forming a rounded opening of a contact window and a via by using a two-step light etching technique, and then some disadvantages of well-known technology are overcome.

SUMMARY OF THE INVENTION

The primary object of the present invention is to provide a fabrication method for forming a rounded corner of a contact window and a via hole by using a two-step light etching technique and supply for following metal-filling process.

Another object of the present invention is to utilize oxygen plasma, which are full of neutral radical and lower energy ion, and fluorocarbon plasma to complete the two-step light etching process. The present invention not only can achieve the object of the rounded corner of a contact window or a via, but also can overcome some disadvantages of charge induced damage and bottom layer loss resulting in prior technology.

A further object of the present invention is to provide a method for forming a rounded corner of a contact window and a via hole by using a two-step light etching technique with visible equipments.

In order to achieve previous objects, the present invention comprises the steps of: forming a flat dielectric layer on a semiconductor device; forming a photoresist layer on the dielectric layer; and etching the dielectric layer by using the photoresist layer as a mask to form a contact window. In the present invention, a first step etching process is performed to remove a portion of the photoresist layer adjacent to the opening of the contact window so as to expose a portion of said dielectric layer adjacent to the contact window; and a second-step etching process is performed to round the exposed portion of the dielectric layer to form a rounded profile of the opening of the contact window; and then to remove the photoresist layer thereon.

Other advantages will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to the FIG. 2A to FIG. 2E, there are schematic representations structures of a cross-sectional view at various stages to illustrate the formulation of a contact window of the present invention in the foregoing. These figures only show main fabrication steps of the manufacture processes.

Figure 1A:
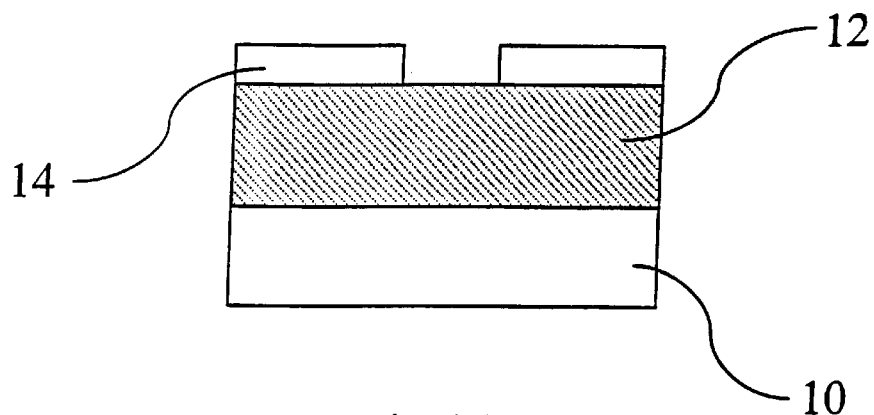
FIG. 1A, FIG. 1B and FIG. 1C are schematic representations structures at various stages during the formulation of a contact window, in accordance with the prior technology.
Figure 1B:
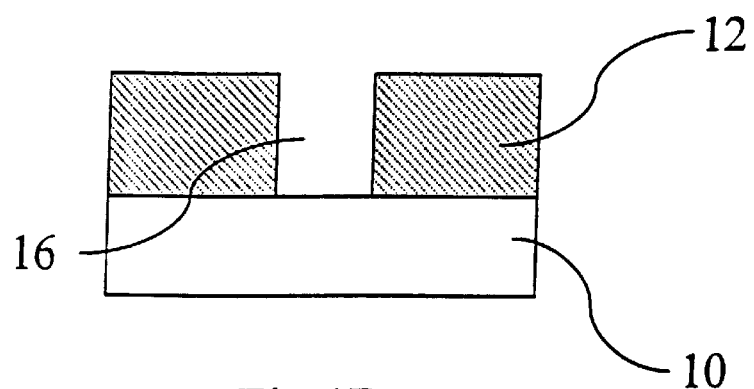
Figure 1C:
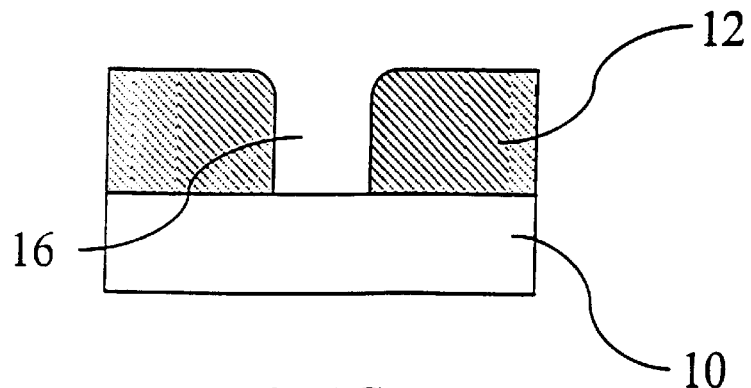
Figure 2A:
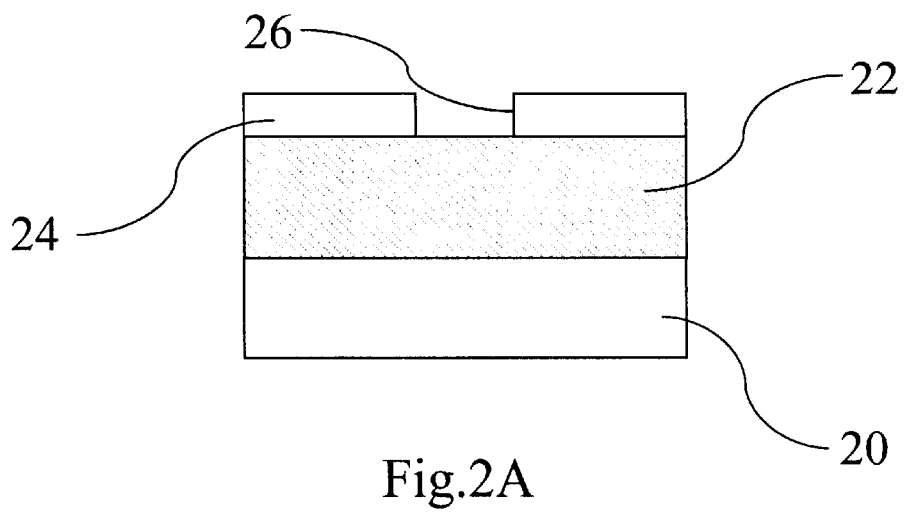
FIG. 2A, FIG. 2B, FIG. 2C, FIG. 2D and FIG. 2E are schematic representations structures at various stages during the formulation of a contact window, in accordance with one preferred embodiment of the present invention.

Referring to the FIG. 2A, a semiconductor substrate 20 is provided and there are basic devices thereon by forgoing processes. For the purpose to simplify the architecture of the drawing, some basis devices, such as MOS transistors, on the semiconductor substrate 20 are temporary not showed therein. A dielectric layer 22 is deposited on a surface of the semiconductor substrate 20, wherein the dielectric layer 22 is made of by selected by the group of borophosphosilicate glass (BPSG), silicon dioxide, tetraethyl-orthosilicate (TEOS), and phosphosilicate glass (PSG). After plaranizing, a thickness of the dielectric layer 22 is between about 5,000 angstrom to 10,000 angstrom. Following, a photolithograph process is performed to coat a photoresist layer 24 on the dielectric layer 22 and then form a patterned photoresist layer 24 by photolithography technique, wherein the patterned photoresist layer 24 is provided with a etching window 26 having a proper size to define the size and location of the contact window.

Figure 2B:
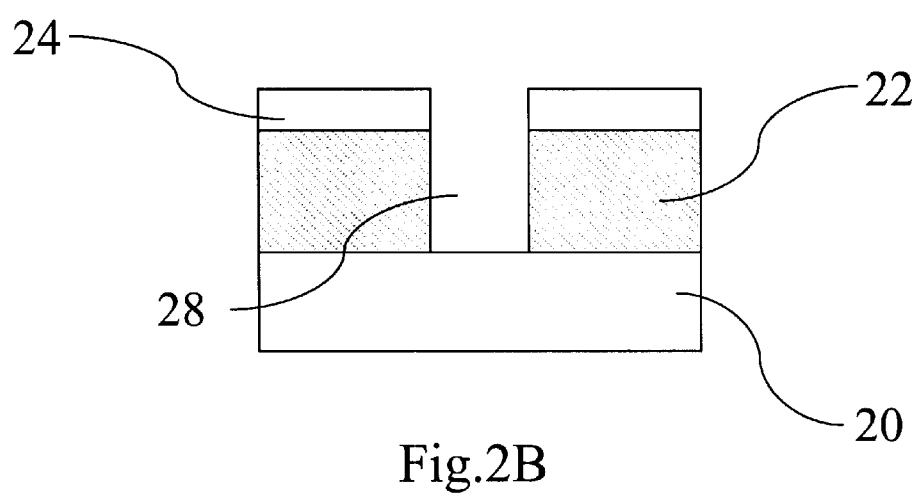

After defining the size of the contact window, a contact window 28 is formed by existing etching technique to etch and remove the exposed portion of the dielectric layer 22 from the etching window 26 and stop till reaching the semiconductor substrate 20, wherein the patterned photoresist layer 24 is used as a mask, such as shown in the FIG. 2B.

Figure 2C:
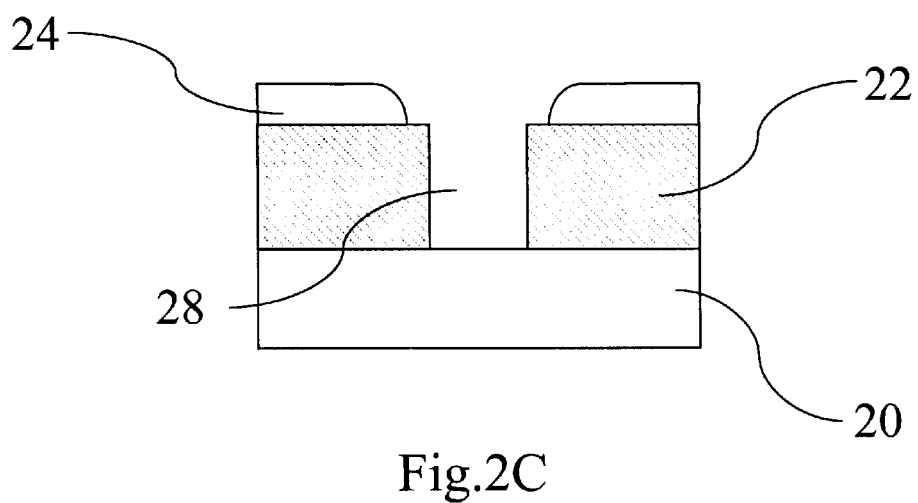
Figure 2D:
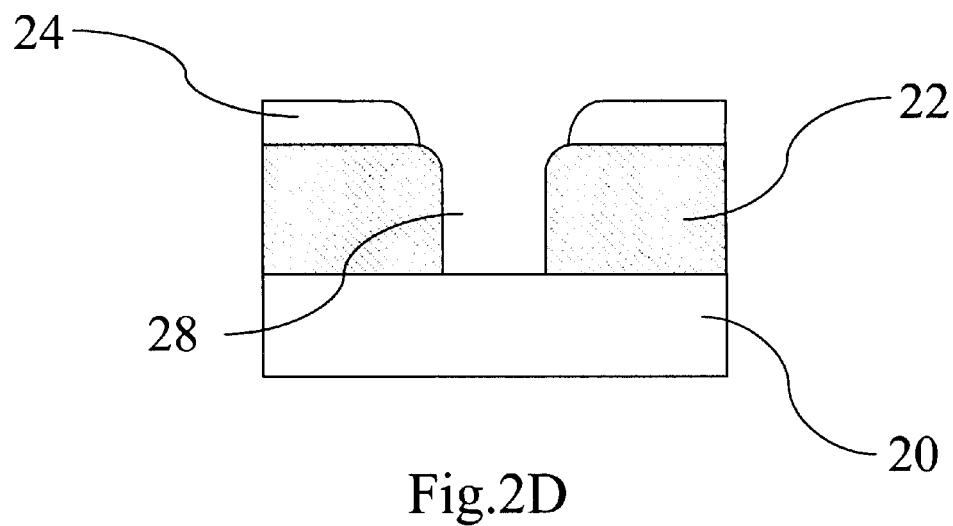

Referring to the FIG. 2C and FIG. 2D, the present invention uses a two-step light etching technique to achieve to form a rounded opening of a contact window. First, an oxygen plasma etching technique is perform to light etch the photoresist layer 24 of the opening of the contact window 28 so as to pullback the photoresist layer 24 to both sides and obtain a rounded profile to widen the size of the contact window 28, such as shown in the FIG. 2C. Wherein, owing to the excellent etching selectivity, oxygen plasma is almost not etching the semiconductor substrate 20 and the dielectric layer 22 so as the present invention will not cause too much damage of bottom substrate loss.

Following, a fluorcarbon plasma etching technique, which is usually used CHF3 as its reaction gas, is perform to light etch the dielectric layer 22, such as shown in the FIG. 2D. The present uses fluorocarbon plasma etching technique of excellent etching selectivity to etch the dielectric layer 22 to form a rounded corner 30 of the opening of the contact window 28 to achieve the object of the invention to obtain a rounded opening of the contact window 28.

Figure 2E:
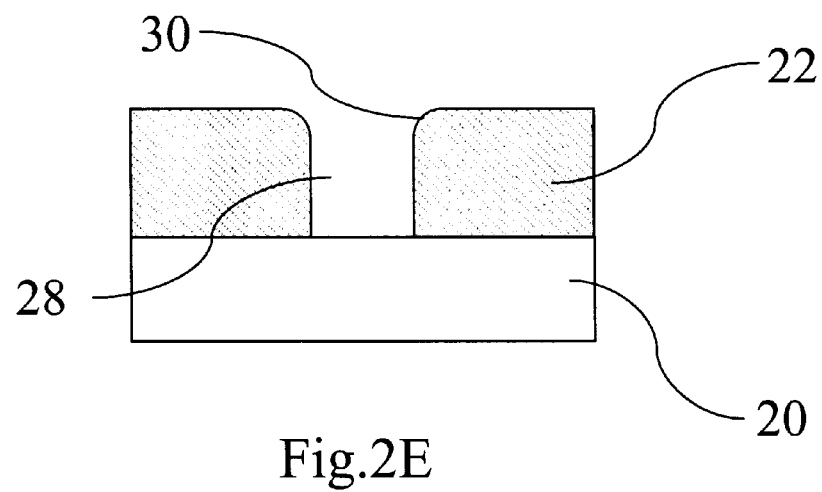

Last, referring to the FIG. 2E, the present invention uses an oxygen plasma etching technique to remove the patterned photoresist layer 24. Then, the dielectric layer 22 on the semiconductor substrate 20 is formed a rounded opening profile of the contact window 28 and this rounded architecture of the contact window of the present invention is helpful for filling the conductive metal layer in the following process.

Another embodiment of the present invention is illustrated in the FIG. 3A to FIG. 3E, which are schematic representations structures of a cross-sectional view at various stages to illustrate the formulation of a via between the metal layer and the metal layer, wherein these figures only show main fabrication steps of the manufacture processes.

Figure 3A:
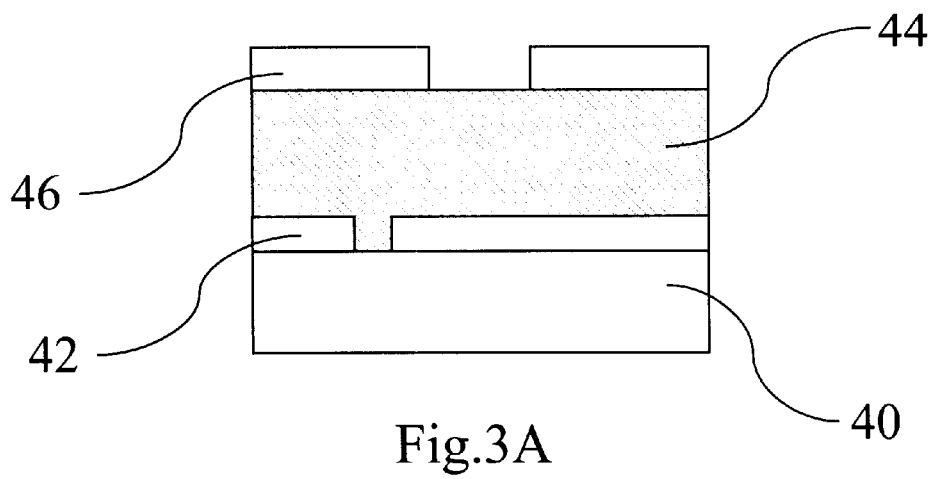
FIG. 3A, FIG. 3B, FIG. 3C, FIG. 3D and FIG. 3E are schematic representations structures at various stages during the formulation of a via, in accordance with one preferred embodiment of the present invention.
Figure 3B:
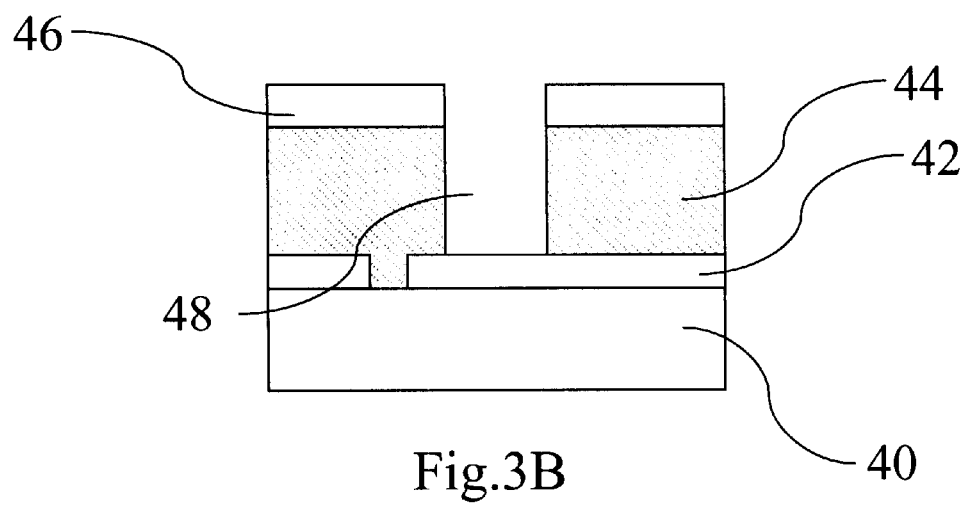
Figure 3C:
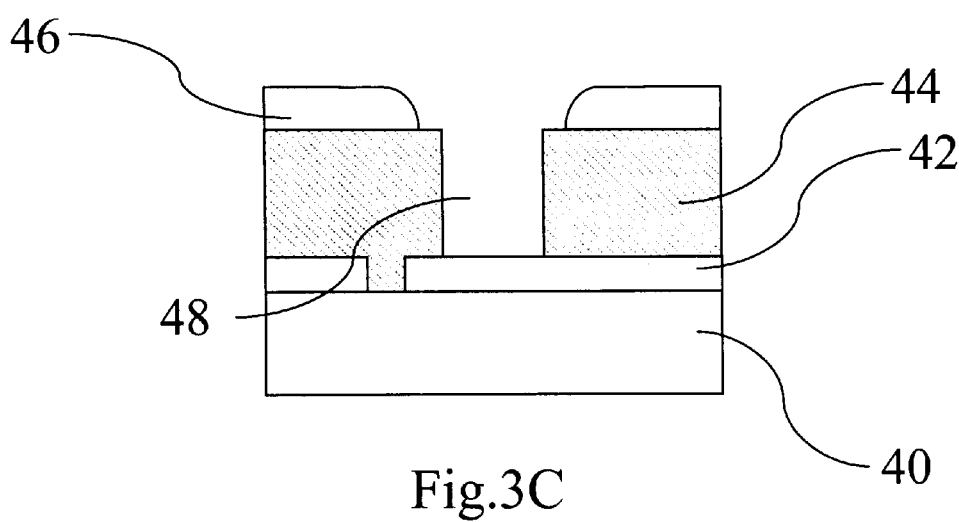
Figure 3D:
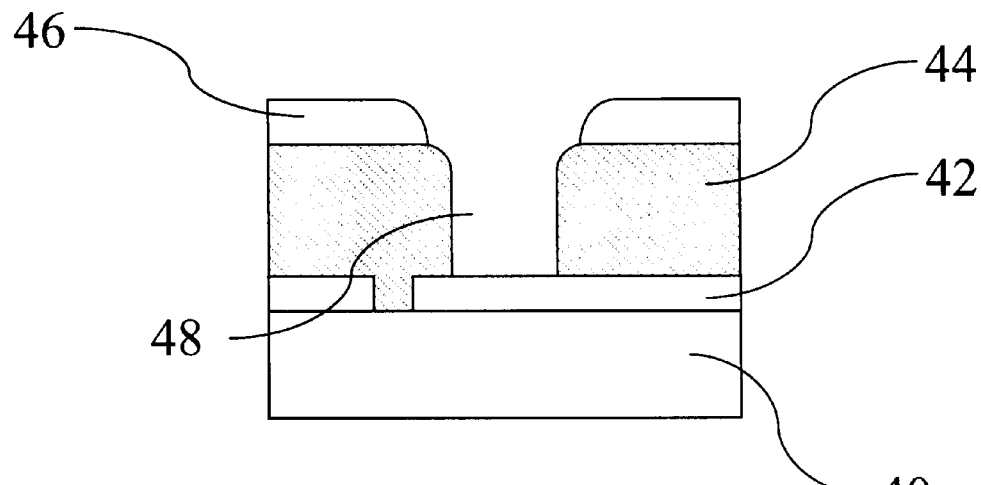
Figure 3E:
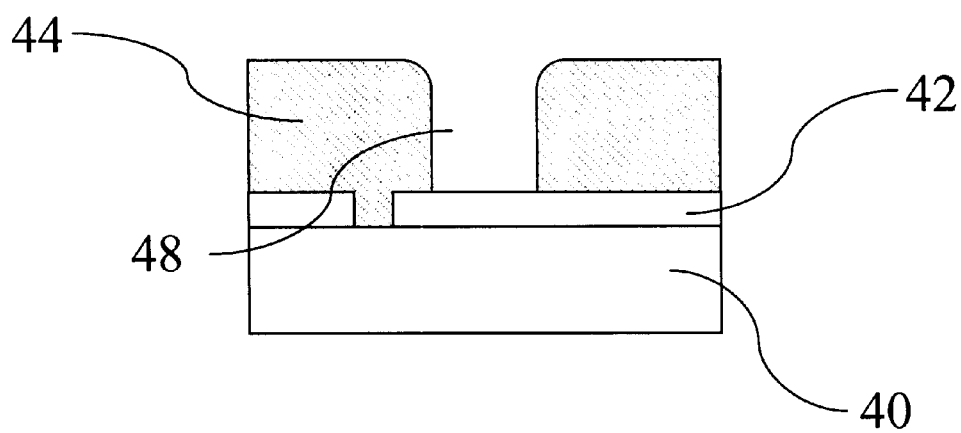

According to the FIG. 3A, a semiconductor substrate 40 completing forward processes is provided and an internal metal layer 42 is formed on the semiconductor substrate 40, wherein the metal layer 42 is made of by selected by the group of Aluminum, Aluminum-Copper Alloy, Aluminum-Silicon-Copper Alloy, and Copper. Then, a flat dielectric layer 44 is formed on the metal layer 42 and the semiconductor substrate 40, and then a patterned photoresist layer 46 is formed on the dielectric layer 44.

Referring to the FIG. 3B to FIG. 3E, after forming a dielectric hole 48 on the dielectric layer 44 by using the patterned photoresist layer 46 as a mask, an oxygen plasma etching technique is performed to light etch the dielectric layer 44 to widen the photoresist layer of the opening of the via so as to expose a portion of said dielectric layer 44 adjacent to the via hole. Then, a CHF3 plasma etching technique is performed to light etch the dielectric layer 44 to form a rounded profile of the opening of the via 48 and an oxygen plasma etching technique is performed to remove the patterned photoresist layer. As a result of the formation of via 48 is similar to the formation of the contact window described forgoing, so there is only simply described herein without detailed illustrated.

Wherein, the mentioned dielectric layer is usually made of by selected by the group of phosphosilicate glass (PSG), fluorosilicate glass (FSG), boronphosphosilicate glass (BPSG), silicon oxide formed by plasma chemical vapor deposition method, and tetraethyl-orthosilicate (TEOS) formed by plasma chemical vapor deposition method.

Besides, after the formation of contact window or via which are mentioned above, the present invention can perform the steps of the oxygen plasma etching process and the fluorocarbon plasma etching process in the same etching. The present invention also can perform the steps of the oxygen plasma etching process and the fluorocarbon plasma etching process the photoresist-free machine before the step of removing the photoresist layer.

However, in comparison of the conventional method for forming the contact window or the via, prior technology only utilizes one-step plasma etching technique to etch the dielectric layer till reaching the silicon substrate. It could not produce the rounded profile of the opening of the contact window or via, so it must utilize higher energy ion to form the rounded profile, but it remains some disadvantages mentioned above. Beside, for the deep sub-micron MOS manufacture and the reduced size of the contact window and via, prior technology could not overcome these advantages. The present invention is to utilize oxygen plasma, which are full of neutral radical and lower energy ion, and fluorocarbon plasma of the two-step light etching process so as the present invention not only can achieve the object of the rounded opening of a contact window or a via for the following processes, but also some disadvantages of charge induced damage and bottom layer loss resulting in prior technology are overcome by the present invention.

The forgoing embodiments of the invention have been presented in a example relative about the contact window or the first-layer via. The present invention also can apply for the process of the second-layer via, the third-layer via, or the following-layer via.

The forgoing description of the embodiments of the invention has been presented for purposes of illustration and description, and is not intended to be exhaustive or to limit the invention to he precise from disclosed. The description was selected to best explain the principles of the invention and practical application of these principles to enable others skilled in the art to best utilize the invention in various embodiments and modifications as are suited to the particular use contemplated. It is intended that the scope of the invention not to be limited by the specification, but be defined by the claim set forth below.

What is claimed is:

1. A fabrication method for forming a rounded corner of a contact window by using a two-step light etching technique, said fabrication method comprising the steps of:

providing a semiconductor device;

forming a dielectric layer on said semiconductor device;

forming a photoresist layer as a mask on said dielectric layer;

etching said dielectric layer to form a contact window;

performing a first-step etching process to remove a portion of said photoresist layer adjacent to the opening of said contact window so as to expose a portion of said dielectric layer adjacent to the contact window; and performing a second-step etching process to remove the exposed portion of said dielectric layer to form a rounded profile of said opening of said contact window and then removing said photoresist layer.

2. The fabrication method according to claim 1, wherein said first-step etching process is an oxygen plasma etching process.

3. The fabrication method according to claim 1, wherein said second-step etching process is a fluorocarbon plasma etching process.

4. The fabrication method according to claim 1, wherein after the formation of said contact window, the steps of said first-step etching process and said second-step etching process are performed in the same etching machine.

5. The fabrication method according to claim 1, wherein after the formation of said contact window, the steps of said first-step etching process and said second-step etching process can be performed in the photoresist-free machine before the step of removing said photoresist layer.

6. The fabrication method according to claim 1, wherein said dielectric layer is made of by selected by the group of silicon oxide, tetraethyl-orthosilicate (TEOS), boronphosphosilicate glass (BPSG), and phosphosilicate glass (PSG).

7. The fabrication method according to claim 1, wherein the step of removing said photoresist layer is using an oxygen plasma etching process.

8. A fabrication method for forming a rounded corner of a via by using a two-step light etching technique, said fabrication method comprising the steps of:

providing a semiconductor device having a metal layer thereon;

forming a flat dielectric layer on said metal layer;

forming a patterned photoresist layer said dielectric layer;

etching said dielectric layer by using said patterned photoresist layer as a mask to form a via hole;

performing a oxygen plasma etching process to remove a portion of said photoresist layer adjacent to the opening of said via hole so as to expose a portion of said dielectric layer adjacent to the via hole; and performing a fluorocarbon plasma etching process to round the exposed portion of said dielectric layer to form a rounded profile of said opening of said via hole and then removing said photoresist layer.

9. The fabrication method according to claim 8, wherein after the formation of said via hole, the steps of said oxygen plasma etching process and said fluorocarbon plasma etching process are performed in the same etching machine.

10. The fabrication method according to claim 8, wherein after the formation of said via hole, the steps of said oxygen plasma etching process and said fluorocarbon plasma etching process can be performed in the photoresist-free machine before the step of removing said photoresist layer.

11. The fabrication method according to claim 8, wherein said dielectric layer is made of by selected by the group of silicon oxide, tetraethyl-orthosilicate (TEOS), boronphosphosilicate glass (BPSG), and phosphosilicate glass (PSG).

12. The fabrication method according to claim 8, wherein the step of removing said photoresist layer is using an oxygen plasma etching process.

* * * * *